United States Patent
Wang et al.

(10) Patent No.: US 12,419,003 B2
(45) Date of Patent: Sep. 16, 2025

(54) CABINET AND SERVER SYSTEM

(71) Applicant: Fulian Precision Electronics (Tianjin) Co., LTD., Tianjin (CN)

(72) Inventors: Pao-Ching Wang, New Taipei (TW); Chieh-Hsiang Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 216 days.

(21) Appl. No.: 18/222,506

(22) Filed: Jul. 17, 2023

(65) Prior Publication Data

US 2024/0334635 A1 Oct. 3, 2024

(30) Foreign Application Priority Data

Mar. 31, 2023 (CN) .......................... 202310348465.5

(51) Int. Cl.
*H05K 7/14* (2006.01)

(52) U.S. Cl.
CPC ................................. *H05K 7/1488* (2013.01)

(58) Field of Classification Search
None
See application file for complete search history.

(56) References Cited

U.S. PATENT DOCUMENTS

| | | | | |
|---|---|---|---|---|
| 6,147,872 A | * | 11/2000 | Roy | H05K 7/1409 361/801 |
| 11,388,829 B2 | * | 7/2022 | Shih | H05K 7/1488 |
| 2003/0080568 A1 | * | 5/2003 | Busby | A47B 81/06 361/801 |
| 2004/0242039 A1 | * | 12/2004 | Griffin | H05K 7/1409 439/157 |
| 2005/0111178 A1 | * | 5/2005 | Bradley | H05K 7/1411 360/99.06 |
| 2006/0215373 A1 | * | 9/2006 | Joist | H05K 7/1409 361/726 |
| 2024/0093706 A1 | * | 3/2024 | Lin | F16B 2/06 |

FOREIGN PATENT DOCUMENTS

CN 112462867 9/2022

* cited by examiner

*Primary Examiner* — Allen L Parker
*Assistant Examiner* — Christopher L Augustin
(74) *Attorney, Agent, or Firm* — ScienBiziP, P.C.

(57) ABSTRACT

A cabinet for mounting server to rack includes a chassis, a handle, a lever, and a linkage. The rack includes a support. The support comprises a first limiting surface and a second limiting surface. An axis of the lever is perpendicular to an axis of the handle, the lever comprises a first limiting part and a second limiting part. When the handle rotates, the linkage drives the lever rotate, the first limiting part pushes the first limiting surface to push the chassis out of the rack, or the second limiting part pushes the second limiting surface to push the chassis into the rack. A server system using the cabinet is also disclosed.

18 Claims, 5 Drawing Sheets

CABINET AND SERVER SYSTEM

FIELD

The disclosure herein generally relates to information handling systems, and more particularly relates to a cabinet and a server system.

BACKGROUND

In server system, for mounting the cabinet to the rack more conveniently, the cabinet usually has a handle. The handle is used to save effort. However, due to the limited space in the front of the cabinet, the handle has insufficient space for structure designing, resulting in the problem of poor labor-saving effect for the handle.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
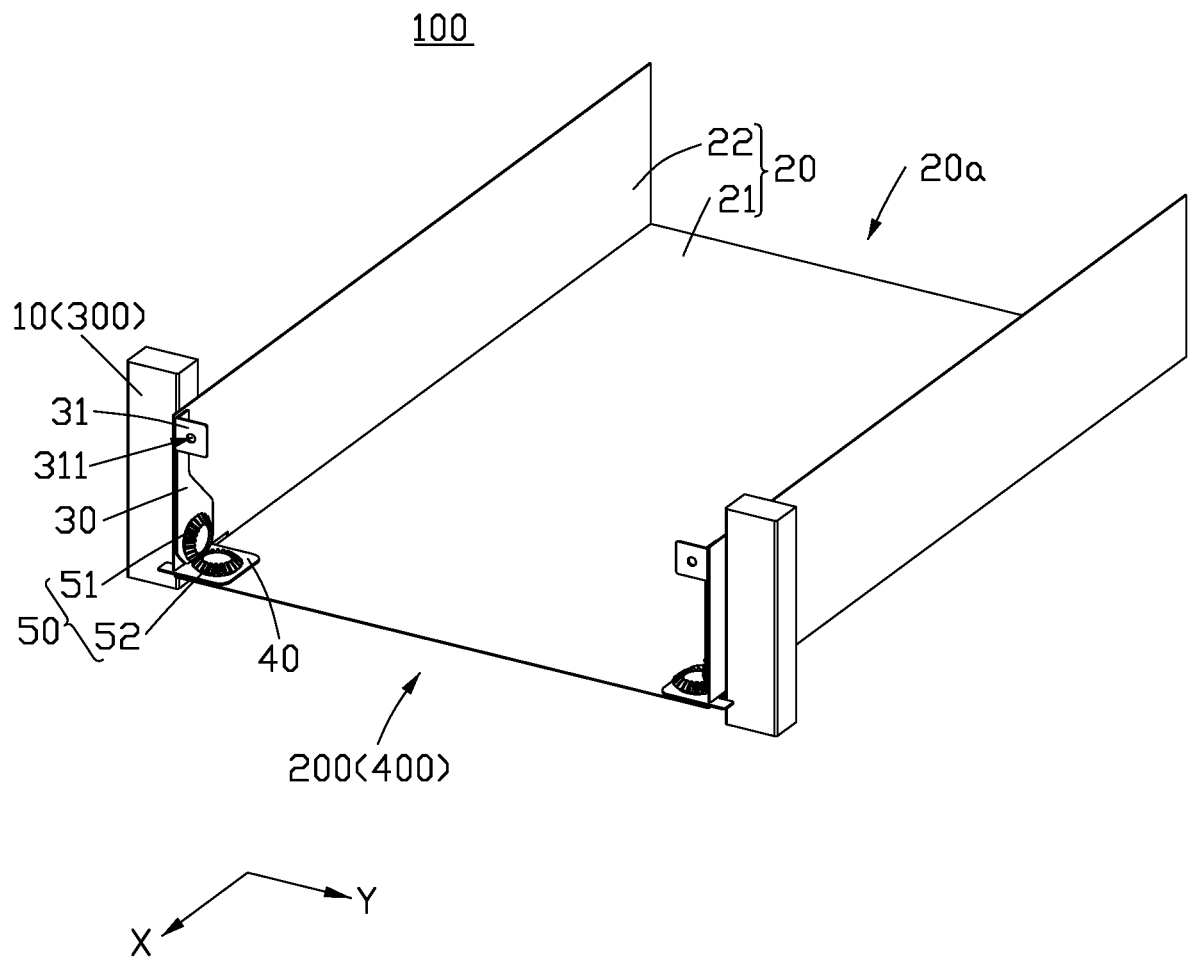
FIG. 1 is an isometric view of a server system according to an embodiment of the present disclosure, showing the rack comprising two supports, and showing the cabinet in a locked position.
Figure 2:
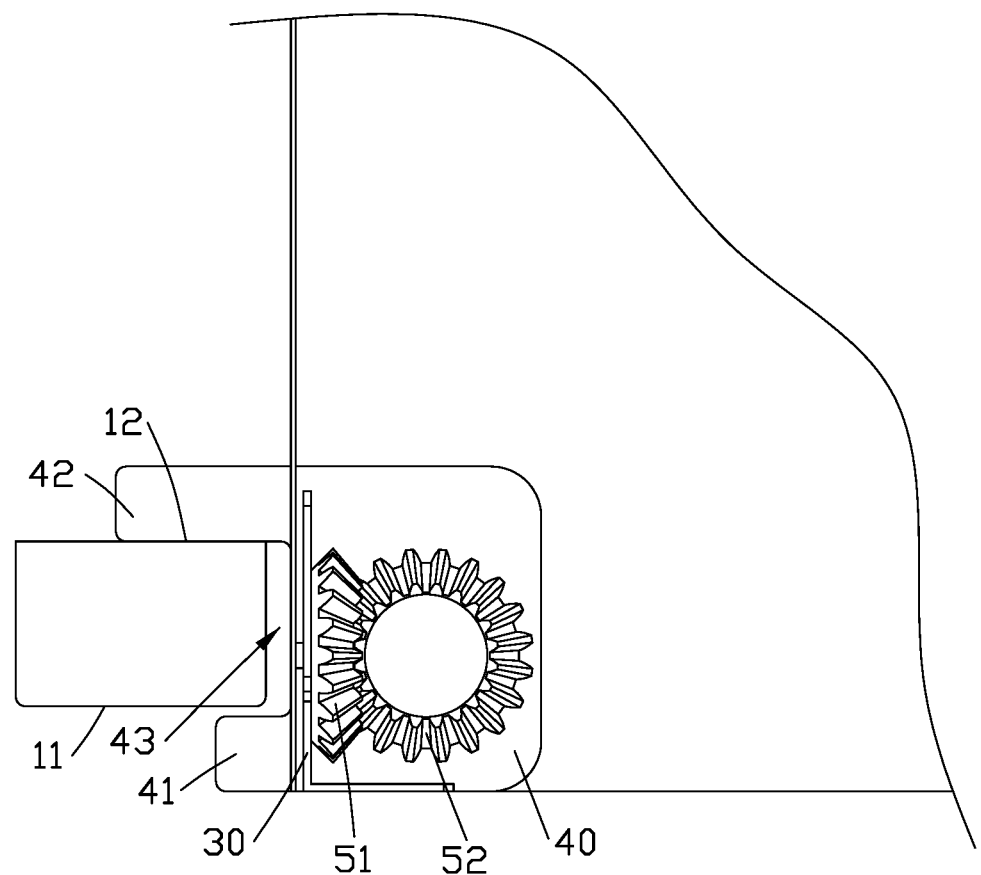
FIG. 2 is a top and cutaway view of the cabinet of FIG. 1.
Figure 3:
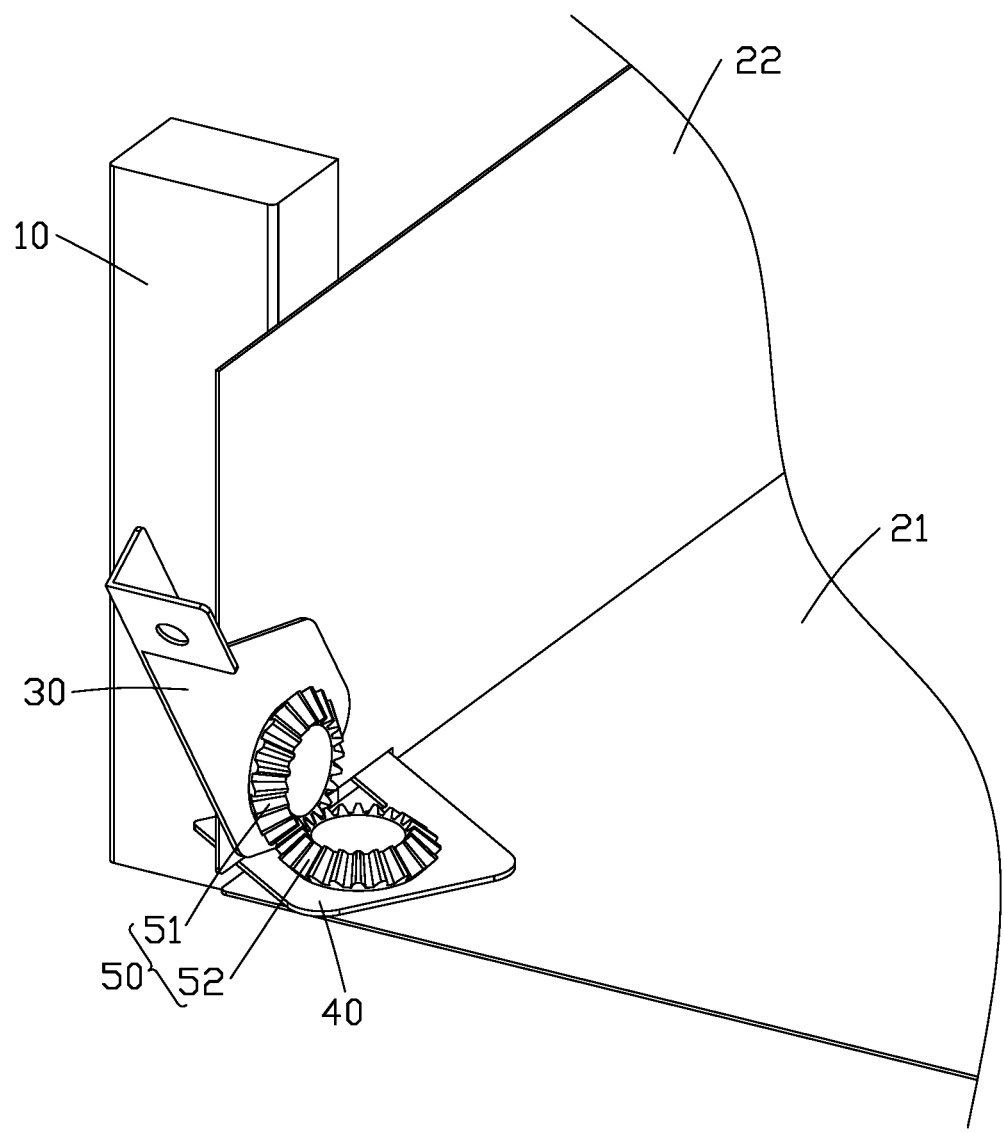
FIG. 3 is an isometric and cutaway view of the cabinet of FIG. 1, showing the cabinet in an unlocked position.
Figure 4:
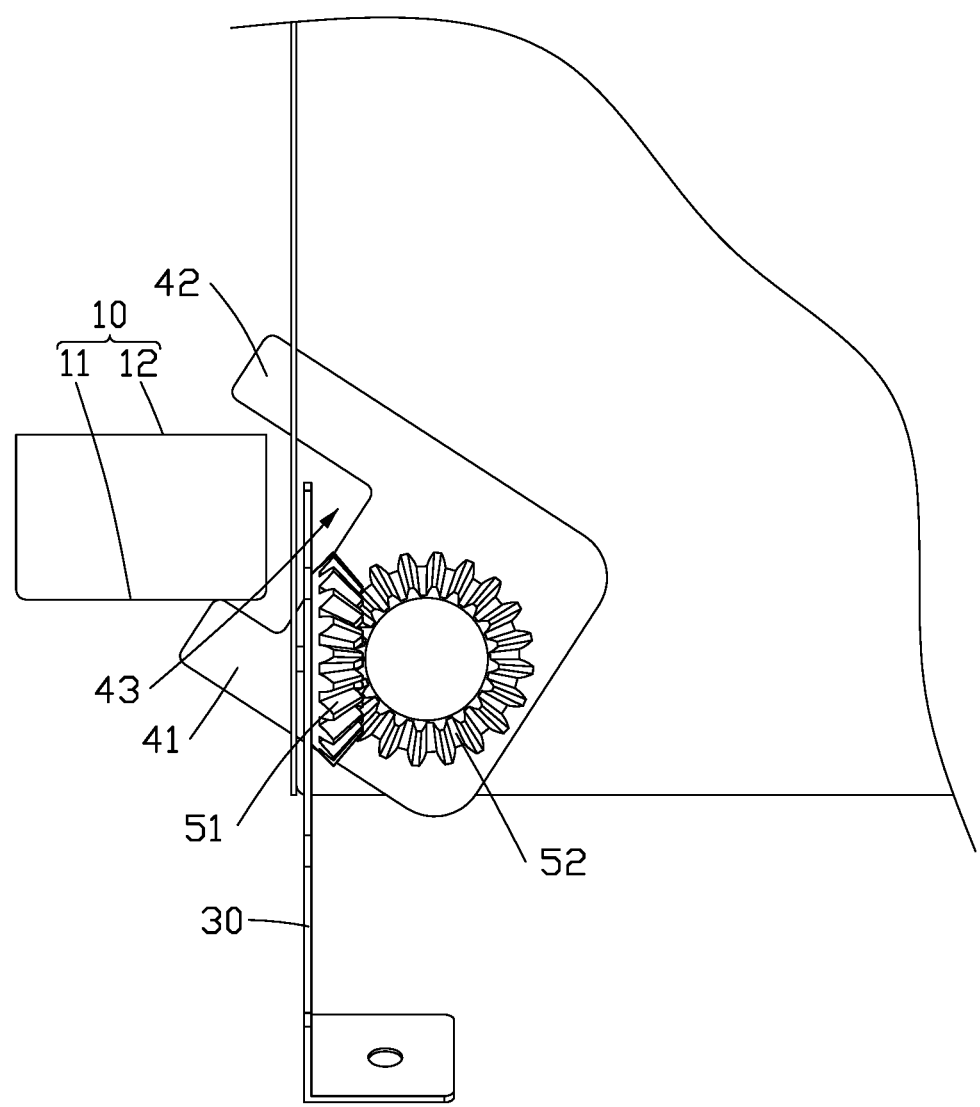
FIG. 4 is a top and cutaway view of the cabinet of FIG. 3.
Figure 5:
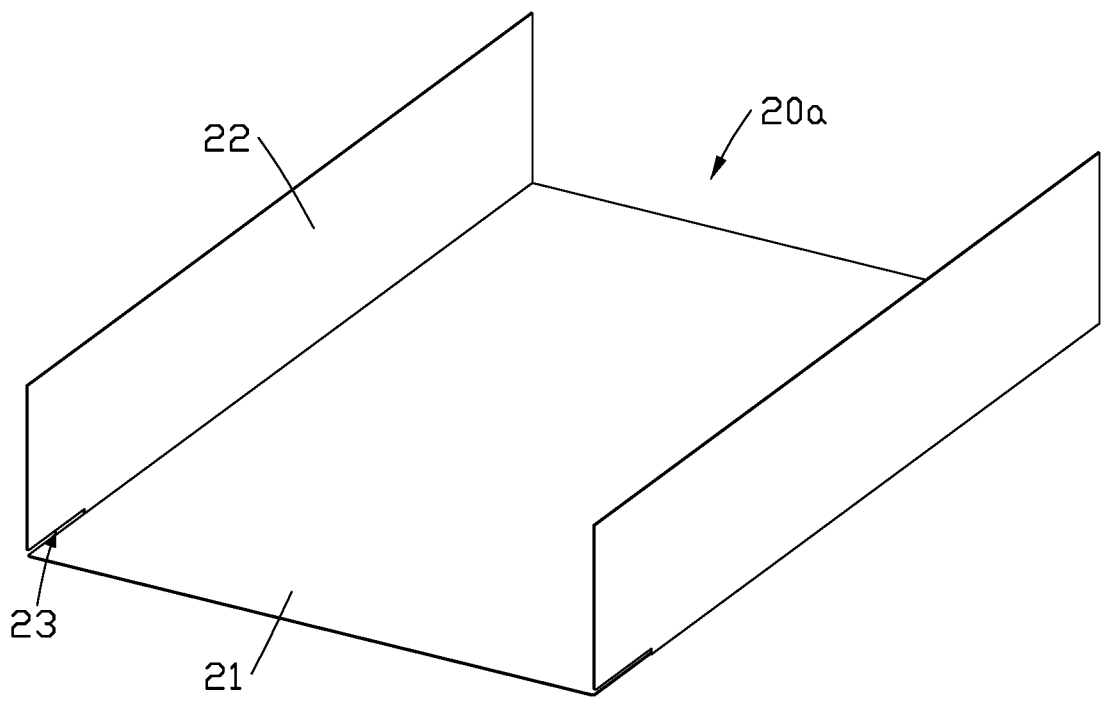
FIG. 5 is an isometric view of a chassis of the cabinet of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1 to FIG. 5, a server system 100 in one embodiment includes a rack 300 and a plurality of servers 400. The plurality of servers 400 can be slidably installed onto the rack 300, such as by rails.

The rack 300 includes at least four supports. Only two supports (supports 10) in the front of the rack 300 are shown in FIG. 1.

Each of the plurality of servers 400 includes a cabinet 200. The cabinet 200 includes a chassis 20, and the chassis 20 is configured for receiving electronic elements, such as, hard disk drives, mainboards, expansion cards, riser cards, and so on.

The rack 300 has an installation position for each server 400. The chassis 20 is detachably located on the installation position, so to install the server 400 into the rack 300. After installing the server 400 into the rack 300, the supports 10 stands beside the chassis 20. Furthermore, the chassis 20 enters the installation position along a X direction, and the supports 10 stands on the side of the chassis 20 along the Y direction.

At least one of the two supports 10 includes a first limiting surface 11 and a second limiting surface 12, and the first limiting surface 11 and the second limiting surface 12 are located on opposite sides of the support 10, and the first limiting surface 11 and the second limiting surface 12 are located on the same side of the installation position.

The cabinet 200 further includes a handle 30, a lever 40, and a linkage 50. The handle 30 is rotatably connected to the chassis 20. The lever 40 is rotatably connected to the chassis 20. The linkage 50 is connected to the handle 30 and the lever 40. The axis of the lever 40 and the handle 30 are perpendicular to each other.

The lever 40 includes a first limiting part 41 and a second limiting part 42. When the chassis 20 is located on the installation position, the first limiting part 41 is located on the side of the first limiting surface 11 opposite to the second limiting surface 12, and the second limiting part 42 is located on the side of the second limiting surface 12 opposite to the first limiting surface 11. The first limiting part 41 and a second limiting part 42 lock the chassis 20 to the support 10, so to lock the server 400 on the rack 300.

When the server 400 is located on the rack 300 and the lever 40 is rotated clockwise, the first limiting part 41 pushes the first limiting surface 11. During the rotation of the lever 40, the chassis 20 will be gradually pushed out of the installation position, so that the server 400 can be taken out from the rack 300.

When to load the server 400 to the rack 300, put the server 400 in the installation position until the first limiting part 41 contact the first limiting surface 11, and then rotate the lever 40 counterclockwise, the second limiting part 42 pushes the second limiting surface 12. During the rotation of the lever 40, the chassis 20 will be gradually pushed into the installation position, so that the server 400 can be positioned on the rack 300.

In some embodiments, the linkage 50 includes a first bevel gear 51 and a second bevel gear 52. The first bevel gear 51 is located on the handle 30 and rotates with the handle 30. The second bevel gear 51 is located on the lever 40 and rotates with the lever 40. The second bevel gear 51 is engaged with the first bevel gear 51. The rotating axis of the first bevel gear 51 and the second bevel gear 52 are perpendicular to each other. When turning the handle 30, the handle 30 rotates the first bevel gear 51, and the first bevel gear 51 rotates the second bevel gear 51, and the second bevel gear 51 rotates the lever 40.

The linkage 50 allows the axis of the lever 40 and the handle 30 are perpendicular to each other, so the force direction of the handle 30 can be vertically transformed. Thereby the linkage 50 saves the space of the chassis 20.

In some embodiments, the chassis 20 includes a bottom wall 21 and a side wall 22, and the side wall 22 is vertical to the bottom wall 21. A cavity 20a is formed between the bottom wall 21 and the side wall 22. The handle 30, the first bevel gear 51 and the second bevel gear 52 are in the cavity 20a. The cavity 20a is used for containing the server 400. The bottom wall 21 is used for supporting the server 400. The side wall 22 is used for positioning the server 400. The support 10 is located on the side of the side wall 22 opposite to the bottom wall 21. The handle 30 is rotatably connected to the inner side of the side wall 22. The lever 40 is rotatably connected to the inner side of the bottom wall 21. The axis of the first bevel gear 51 is vertical to the side wall 22. The axis of the second bevel gear 52 is perpendicular to the bottom wall 21. The handle 30, the lever 40 and the linkage 50 are located on the outer end of the bottom wall 21 and the side wall 22.

In some embodiments, the handle 30 and the lever 40 is sheet metal, the handle 30 is connected to the side wall 22, and the lever 40 is connected to the bottom wall 21.

When the server 400 is located on the rack 300, the handle 30 is in the cavity 20a. And when to take out the server 400 from the rack 300, the handle 30 is rotated out of the cavity 20a.

In some embodiments, a groove 23 is defined in the bottom wall 21 or the side wall 22. The groove 23 communicates with the cavity 20a, the lever 40 can extend out of the cavity 20a via the groove 23. The first limiting part 41 and the second limiting part 42 are able to extend out of the chassis 20, so to abut against the support 10. When the server 400 is located on the rack 300, the first limiting part 41 and the second limiting part 42 are extended out of the cavity 20a via the groove 23. When to take the server 400 out of the rack 300 or to put the server 400 into rack 300, the second limiting part 42 is in the cavity 20a, and only the first limiting part 41 is extended out of the cavity 20a via the groove 23, avoiding the second limiting part 42 interfering with the support 10.

In some embodiments, the extendable part of the lever 40 out of the chassis 20 has an opening 43. The opening 43 is located between the first limiting part 41 and the second limiting part 42. The opening 43 is configured for avoiding the support 10.

In some embodiments, the first limiting surface 11 and the second limiting surface 12 are parallel to each other. The distance between the first limiting part 41 and the second limiting part 42 is greater than the distance between the first limiting surface 11 and the second limiting surface 12, to avoid the lever 40 being stuck when the lever 40 turns. In some embodiments, the support 10 is a pipe with a rectangular cross-section, and the first limiting surface 11 and the second limiting surface 12 are the two opposite sides of the pipe.

In some embodiments, the handle 30 includes a fold part 31, the fold part 31 is located on the side of the handle 30 opposite to the linkage 50. The fold part 31 is vertical to the side wall 22. A mounting hole 311 is defined in the fold part 31. The mounting hole 311 can be aligned with a hole of the chassis 20. The mounting hole 311 is configured for mounting screws to fix the handle 30 to the chassis 20, avoiding the chassis 20 from being separated from the rack 300. When the server 400 is located on the rack 300, the mounting hole 311 is aligned with the hole of the chassis 20.

In some embodiments, there are two supports 10 and two levers 40. When the server 400 is located on the rack 300, two supports 10 are located on opposite sides of the chassis 20 in the direction Y. Two levers 40 are connected on either side of the chassis 20 in the direction Y. Each of the two levers 40 is configured for pushing the support 10 on the same side.

Furthermore, there are two handles 30 and two linkages 50. Each of the two levers 40 is connected to one handle 30 by one linkage 50. When to load the server 400 in the rack 300, rotate the two handles 30 respectively to latch both sides of the chassis 20 to the supports 10. When to unload the server 400 from the rack 300, rotate the two handles 30 respectively to unlatch the both sides of the chassis 20 from the supports 10. The two handles 30 provides double insurances, preventing the chassis 20 from being separated from the rack 300.

In some other embodiments, there are two supports 10, two levers 40, one handle 30, and one linkage 50. The two levers 40 are rotated by the one handle 30 and the one linkage 50 synchronously. When the handle 30 is turned, the two first bevel gears 51 and the two second bevel gears 52 rotates synchronously, so that the two levers 40 push the two supports 10 at the same time.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A cabinet configured for mounting a server to a rack, the cabinet comprising:
    a chassis;
    a handle rotatably connected to the chassis;
    a lever rotatably connected to the chassis; and
    a linkage connected to the handle and the lever,
    wherein an axis of the lever is perpendicular to an axis of the handle, the lever comprises a first limiting part and a second limiting part, and
    when the handle is rotated, the handle rotates the lever by the linkage, the first limiting part pushes a first limiting surface of the rack to push the chassis out of the rack, or the second limiting part pushes a second limiting surface of the rack to push the chassis into the rack;
    the linkage comprises a first bevel gear and a second bevel gear, the first bevel gear is located on the handle and rotates with the handle, the second bevel gear is located on the lever and engages with the first bevel gear, an axis of the first bevel gear is perpendicular to an axis of the second bevel gear.

2. The cabinet of claim 1, wherein the chassis comprises a bottom wall and a side wall, the side wall is perpendicular to the bottom wall, the handle is rotatably connected to the side wall, the lever is rotatably connected the bottom wall, an axis of the first bevel gear is perpendicular to the side wall, an axis of the second bevel gear is perpendicular to the bottom wall.

3. The cabinet of claim 2, wherein a cavity is defined between the bottom wall and the side wall, the handle, the first bevel gear, and the second bevel gear are located in the cavity.

4. The cabinet of claim 3, wherein a groove is defined between the bottom wall and the side wall, the groove is communicated with the cavity, the lever is partially located in the cavity, and the first limiting part and the second limiting part extend out of the cavity through the groove.

5. The cabinet of claim 4, wherein an opening is defined on the lever, the opening is located between the first limiting part and the second limiting part, the opening is configured for avoiding a support.

6. The cabinet of claim 1, wherein the handle comprises a fold part, the fold part is located on a side of the handle away from the linkage, the fold part defines a mounting hole.

7. The cabinet of claim 1, wherein the first limiting surface and the second limiting surface are parallel, a distance between the first limiting part and the second limiting part is greater than a distance between the first limiting surface and the second limiting surface.

8. A server system comprising:
a plurality of servers; and
a rack,
wherein the rack comprises a support, each of the plurality of servers comprises a cabinet, the cabinet comprises:
a chassis;
a handle rotatably connected to the chassis;
a lever rotatably connected to the chassis; and
a linkage connected to the handle and the lever;
the chassis is located on a side of the support, the support comprises a first limiting surface and a second limiting surface, the first limiting surface and the second limiting surface are located on opposite sides of the support and are located on a same side of the chassis, an axis of the lever is perpendicular to an axis of the handle, the lever comprises a first limiting part and a second limiting part, and
when the handle is rotated, the handle rotates the lever by the linkage, the first limiting part pushes the first limiting surface to push the chassis out of the rack, or the second limiting part pushes the second limiting surface to push the chassis into the rack;
the linkage comprises a first bevel gear and a second bevel gear, the first bevel gear is located on the handle and rotates with the handle, the second bevel gear is located on the lever and engages with the first bevel gear, an axis of the first bevel gear is perpendicular to an axis of the second bevel gear.

9. The server system of claim 7, wherein the chassis comprises a bottom wall and a side wall, the side wall is perpendicular to the bottom wall, the support is located on a side of the side wall opposite to the bottom wall, the handle is rotatably connected to the side wall, the lever is rotatably connected the bottom wall, an axis of the first bevel gear is perpendicular to the side wall, an axis of the second bevel gear is perpendicular to the bottom wall.

10. The server system of claim 9, wherein a cavity is defined between the bottom wall and the side wall, the handle, the first bevel gear, and the second bevel gear are located in the cavity.

11. The server system of claim 10, wherein a groove is defined between the bottom wall and the side wall, the groove is communicated with the cavity, the lever is partially located in the cavity, and the first limiting part and the second limiting part extend out of the cavity through the groove.

12. The server system of claim 11, wherein an opening is defined on the lever, the opening is located between the first limiting part and the second limiting part, the opening is configured for avoiding the support.

13. The server system of claim 8, wherein the handle comprises a fold part, the fold part is located on a side of the handle away from the linkage, the fold part defines a mounting hole.

14. The server system of claim 8, wherein the first limiting surface and the second limiting surface are parallel, a distance between the first limiting part and the second limiting part is greater than a distance between the first limiting surface and the second limiting surface.

15. A server system comprising:
a plurality of servers; and
a rack,
wherein the rack comprises two supports, each of the plurality of servers comprises a cabinet, the cabinet comprises:
a chassis;
two handles rotatably connected to the chassis;
two levers rotatably connected to the chassis; and
two linkages connected to the two handles and the two levers;
the chassis is located between the two supports, each of the two supports comprises a first limiting surface and a second limiting surface, the first limiting surface and the second limiting surface are located on opposite sides of each of the two supports and are located on a same side of the chassis, each of the two levers is respectively connected to each of the two handles by each of the two linkages, an axis of each of the two levers is perpendicular to an axis of each of the two handles, each of the two levers comprises a first limiting part and a second limiting part, and
when each of the two handles is rotated, each of the two handles rotates each of the two levers by each of the two linkages, each of the two first limiting parts pushes each of the two first limiting surfaces to push the chassis out of the rack, or each of the two second limiting parts pushes each of the two second limiting surfaces to push the chassis into the rack.

16. The server system of claim 15, wherein each of the two linkages comprises a first bevel gear and a second bevel gear, each of the two first bevel gears is located on each of the two handles and rotates with each of the two handles, each of the two second bevel gears is located on each of the two levers and engages with each of the two first bevel gears, an axis of each of the two first bevel gears is perpendicular to an axis of each of the two second bevel gears.

17. The server system of claim 16, wherein the chassis comprises a bottom wall and two side walls, the two side walls are perpendicular to the bottom wall, the two side walls are located on opposite sides of the bottom wall, each of the two handles is rotatably respectively connected to each of the two side walls, the two levers is rotatably connected the bottom wall, an axis of each of the two first bevel gears is perpendicular to each of the two side walls, an axis of each of the two second bevel gears is perpendicular to the bottom wall.

18. The server system of claim 17, wherein a cavity is defined between the bottom wall and the two side walls, the two handles, the two first bevel gears, and the two second bevel gears are located in the cavity, two grooves is defined and each of the two grooves is located between the bottom wall and each of the two side walls, the two grooves are communicated with the cavity, each of the two levers is partially located in the cavity, and each of the two first limiting parts and each of the two second limiting parts extend out of the cavity through each of the two grooves.

\* \* \* \* \*